(12) United States Patent
Pasotti et al.

(10) Patent No.: US 6,392,931 B1
(45) Date of Patent: May 21, 2002

(54) METHOD FOR HIGH PRECISION PROGRAMMING NONVOLATILE MEMORY CELLS, WITH OPTIMIZED PROGRAMMING SPEED

(75) Inventors: Marco Pasotti, S. Martino Siccomario; Roberto Canegallo, Tortona; Giovanni Guaitini, Trecella; Frank Lhermet, Vimercate; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/449,168

(22) Filed: Nov. 24, 1999

(30) Foreign Application Priority Data

Nov. 27, 1998 (IT) .......................................... TO98A1003

(51) Int. Cl.$^7$ ................................................. G11C 7/00
(52) U.S. Cl. ............................ 365/185.19; 365/185.18; 365/185.22; 365/185.14; 365/185.24; 365/185.28
(58) Field of Search ....................... 365/185.19, 185.18, 365/185.22, 185.14, 185.24, 185.28

(56) References Cited

U.S. PATENT DOCUMENTS

| 3,591,824 | A | * | 7/1971 | Hanbicki ...................... 315/24 |
| 5,986,936 | A | * | 11/1999 | Ravazzini .............. 365/185.19 |
| 5,995,416 | A | * | 11/1999 | Naura et al. ........... 365/185.18 |
| 6,011,715 | A | * | 1/2000 | Pasotti et al. .......... 365/185.03 |
| 6,172,908 | C1 | * | 1/2001 | Cappelletti et al. .... 365/185.19 |

\* cited by examiner

*Primary Examiner*—Viet Q. Nguyen
(74) *Attorney, Agent, or Firm*—Lisa K. Jorgenson; Robert Iannucci; Seed IP Law Group, PLLC

(57) ABSTRACT

A programming method comprises the steps of applying a ramp voltage having a first slope to the gate terminal of a selected memory cell to rapidly bring the threshold voltage of the selected cell to an intermediate value; then applying a ramp voltage having a second slope lower than the first, to end programming to the desired final threshold value with high precision. Thereby, when a high threshold value is to be programmed, programming time is reduced; on the other hand, if a low threshold value is to be programmed, the slower ramp voltage is applied right from the start, to prevent possible overprogramming of the cell.

21 Claims, 3 Drawing Sheets

METHOD FOR HIGH PRECISION PROGRAMMING NONVOLATILE MEMORY CELLS, WITH OPTIMIZED PROGRAMMING SPEED

TECHNICAL FIELD

The present invention refers to a method for high precision programming nonvolatile memory cells, with optimized programming speed.

BACKGROUND OF THE INVENTION

As is known, at present nonvolatile memory cells, in particular flash memory cells, are programmed by biasing the gate terminal of the cell to be written (via a word line) at a first preset potential (e.g., 8–9 V), the drain terminal (via a bit line) at a second preset potential (e.g., 5 V), and the source terminal at ground. In this way, hot selectrons are injected, i e., electrons are trapped in the cell floating gate region and the cell threshold voltage is modified.

Injection of hot electrons is, by its very nature, non-controlled and nonrepeatable with precision. Consequently, at present programming is carried out supplying a plurality of programming pulses and reading the cell threshold voltage after each programming pulse (verify step) to verify whether the desired value has been reached and to decide whether to apply or not Her programming pulses.

Currently under study are techniques for storing high density digital data (able to supply more than eight levels). These techniques require the use of feedback circuits in the programming circuitry (which is intended to supply the programming pulses and carry out the verify read operation). These circuits, however, make the verify step slower and make programming (which may comprise, altogether, 70–100 verify steps) longer.

It is moreover known that, when a voltage (either constant or pulsed) is applied on the drain terminal of the cell to be programmed, and a linearly increasing (ramp) voltage is applied on its control gate terminal, after a certain time the threshold voltage varies according to the same slope as the ramp. In this connection, reference is made to the article by C. Calligaro, A. Manstretta, A. Modelli, G. Torelli, "Technological and design constraints for multilevel flash memories", Proceedings of International Conference on Electronic Circuits and Systems, Rodes, Greece, pp. 1003–1008.

Exploiting this correlation, it has already been proposed (see European Patent Application No. 97830566.2 dated Nov. 3, 1997, in the name of the present assignee, incorporated herein by reference) to calculate the time necessary for the cell to be programmed to reach the desired threshold voltage starting from an initial threshold value, when the slope of the voltage ramp applied is known, so as to eliminate intermediate verify steps.

In particular, in the above referred patent application, the control gate terminal is supplied with a discrete ramp voltage comprising a series of voltage pulses having a constant preset duration $\Delta\tau$ and increasing amplitude with constant increment $\Delta V$; consequently, the ramp has an average slope $m=\Delta V/\Delta\tau$.

Since, in equilibrium, the threshold voltage of the cells to be programmed increases with a slope equal to the average slope m, the method described in this patent calculates, and then applies in succession, the number of voltage pulses necessary for obtaining the desired threshold voltage increment, without carrying out verify operations after each pulse, thus making it possible to reduce the total number of verify steps.

It is moreover known that the programming precision depends upon the amplitude of the voltage increment or step $\Delta V$ applied to each programming pulse (see, for example, the article by P. L. Rolandi, R. Canegallo, E. Chioffi, D. Gema, G. Guaitini, C. Issartel, A. Kramer, F. Lhermet, M. Pasotti "1M-Cell 6b/cell Analog Flash Memory for Digital Storage", ISSCC98, S. Francisco, Session: Memory, pp. 334–335). Consequently, to increase programming precision (and hence the number of programmable levels in a single cell), it is necessary to reduce the amplitude of the steps. However, the duration of the programming pulses is constant, therefore it is necessary to reduce the average slope of the ramp and hence increase the time necessary for programming the memory cell, as may be seen in the plot of FIG. 1, which shows the successions of pulses having two different amplitudes $\Delta V1$ and $\Delta V2$, one of which is twice as great as the other, necessary for reaching a same final value $V_F$ of the control gate voltage, starting from a same initial value $V_0$.

This disadvantage is all the more noticeable, the higher the final threshold voltage to be programmed, in that, in this case, it is necessary to apply a high number of pulses, and the read time is significantly lengthened. Consequently, when a high programming precision is required, programming becomes slow.

SUMMARY OF THE INVENTION

The aim of the present invention is to provide a programming method overcoming said drawback.

BRIEF DESCRIPTION OF THE DRAWINGS

For a better understanding of the invention, an embodiment thereof is now described, as a non-limiting example and with reference to the attached figures, wherein.

DETAILED DESCRIPTION OF THE INVENTION

The circuit used for implementing the present method is substantially the same described in the above referred patent application and hereinafter described with reference to FIG. 2 for clarity.

Figure 2:
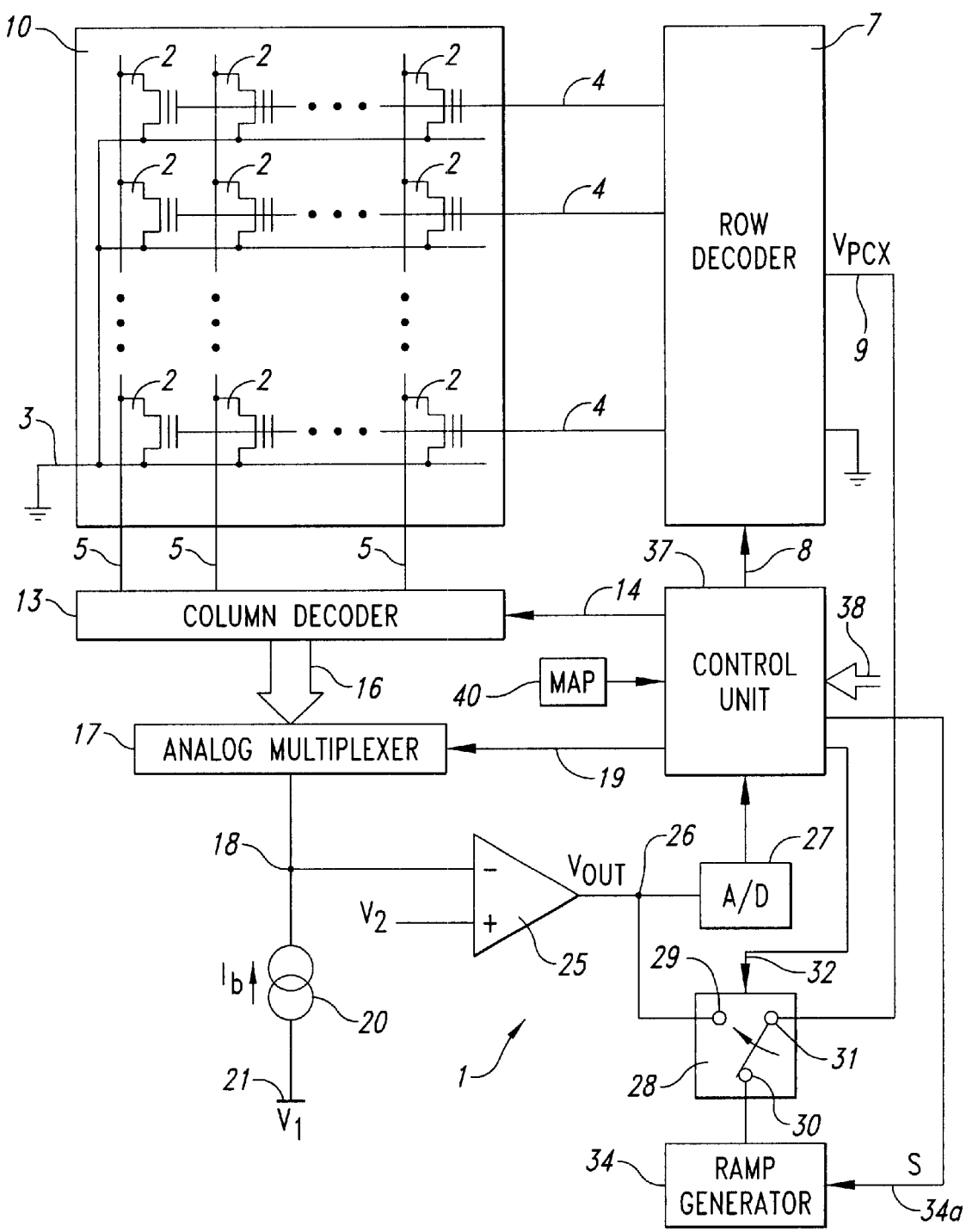
FIG. 2 illustrates a simplified circuit diagram for a nonvolatile memory implementing the programming method according to the present invention.

FIG. 2 shows a sector 10 of a nonvolatile analog memory 1, for example of the flash type, and the components of the memory 1 that intervene during programming. In particular, the sector 10 comprises a plurality of cells 2 arranged in rows and columns. The control gate terminals of the cells 2 arranged on a same row are connected together through a word line 4; the drain terminals of the cells 2 arranged in a same column are connected together through a bit line 5; and the source terminals of all the cells 2 are connected together and available externally (in the example illustrated, during programming, they are connected to the ground line 3).

The word lines 4 are connected to a row decoder 7 having a control input 8 receiving address signals, and a bias input 9 receiving a gate voltage $V_{pcx}$. In a per se known manner, the row decoder 7 supplies the voltage $V_{pcx}$ to one word line 4 at a time, as specified by the address signals supplied on the control input 8.

The bit lines 5 are connected to a column decoder 13 which, as specified by address signals supplied on one of its control inputs 14, in a per se known manner selectively connects the bit lines 5 to a bus 16 including eight lines. The bus 16 is then connected to an analog multiplexer 17, connecting only one of the bus lines 16 to an output node 18 according to a control signal supplied on one of its control inputs 19.

The node 18 is connected to a first terminal of a current source 20 having a second terminal connected to a reference line 21 set at a voltage $V_1$ and generating a bias current $I_b$. The node 18 is further connected to an inverting input of an operational amplifier 25 having a non-inverting input receiving a reference voltage $V_2$. The output of the operational amplifier 25 defines a node 26 connected to an input of an analog/digital converter 27 and to a first input 29 of a two position selector 28. The selector 28 has a second input 30 connected to a ramp generator 34, and an output 31 connected to the bias input 9 of the row decoder 7.

The ramp generator 34 is of the programmable type and has a control input 34a receiving a control signal S issued by a logic control unit 37. In detail, the ramp generator 34 generates at its output a voltage increasing in a discrete way with steps of two different values, according to the control signal S. In addition, the two different values of the steps can be programmed, for example in the design phase, according to the preset number of levels (number of bits per cell), as explained in greater detail hereinafter. For example, the amplitude of the higher steps may be comprised between 50 and 300 mV, and the amplitude of the lower steps may be comprised between 5 and 50 mV.

The output of the A/D converter 27 is supplied to the logic control unit 37 having an input 38 for communicating with not illustrated components of the memory 1 (to receive programming instructions, addresses of the cells to be written, and threshold values at which the cells are to be programmed), and a plurality of outputs connected to the outputs 8, 14, 19 and to a selection input 32 of the selector 28. The logic control unit 37 is connected to a permanent storage area of the memory 1, indicated as map 40, for storing information necessary for programming, as described in detail hereinafter.

Figure 4:
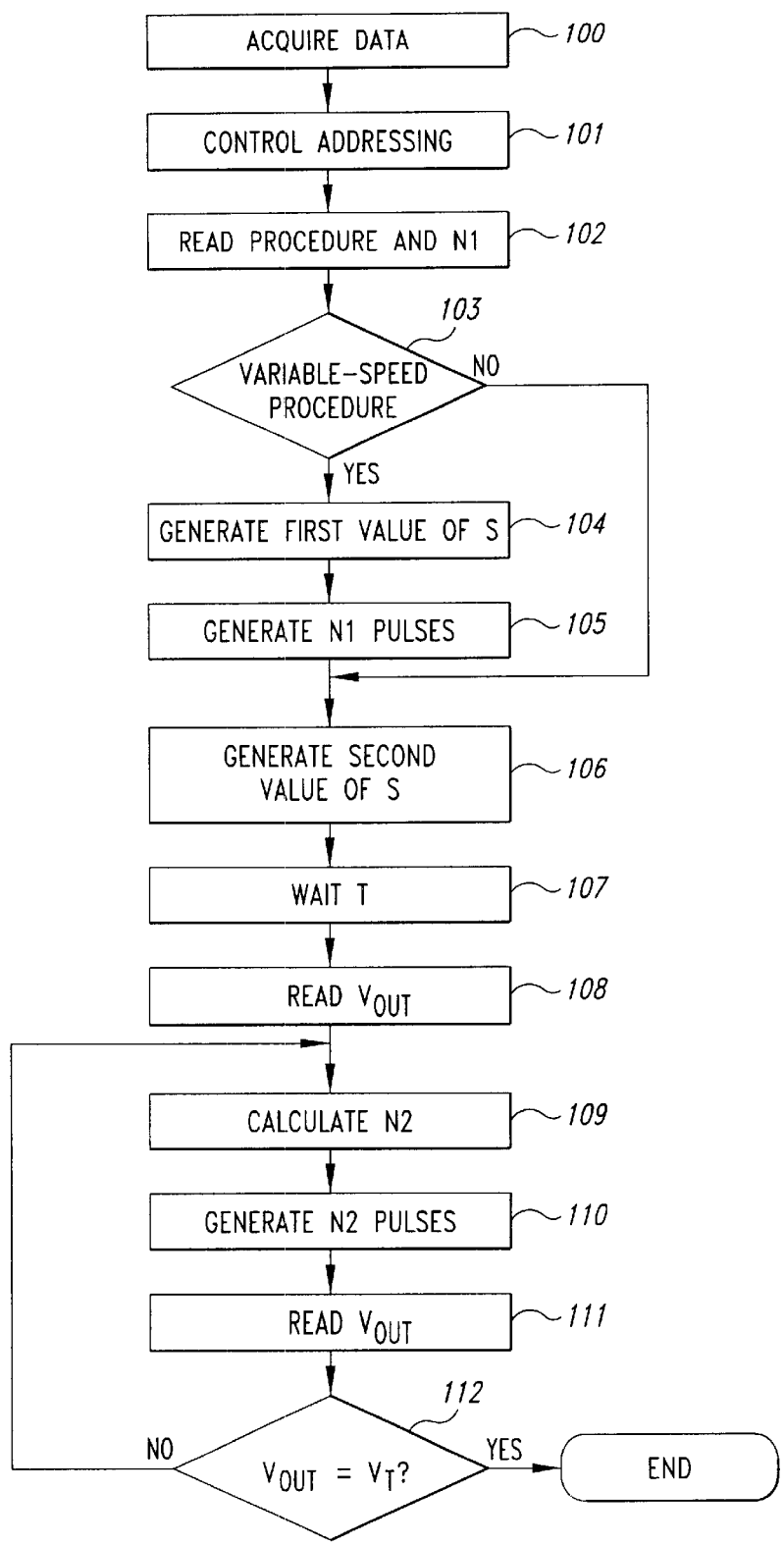
FIG. 4 shows a flowchart of the programming method according to the invention.

When one or more cells 2 of the sector 10 are to be programmed, the logic control unit 37 decides, according to the level to be programmed, whether to directly activate a slow, but precise, programming procedure, setting the ramp generator 34 through a first value of the control signal S which specifies generation of voltage steps of small amplitude, or whether to initially activate a fast, but less precise, programming procedure, setting the ramp generator 34 through a second value of the control signal S which specifies the generation of voltage steps of high amplitude, and then, after a preset time, switch to the slow programming step, as described hereinafter with reference to the flowchart of FIG. 4.

For programming, the logic control unit 37 controls the selector 28 so as to connect the output 31 thereof to the input 30, i.e., in such a way that the voltage $V_{pcx}$ supplied to the input of the decoder 7 increases as determined by the value of the control signal S with steps of either small or high amplitude. In addition, as described in detail in the above referred European patent application, the logic control unit 37 controls the row decoder 7 and the column decoder 13 so that these supply, respectively, the voltage $V_{pcx}$ to the selected word line 4, to which the cell to be programmed is connected, and the preset drain voltage to the selected bit line 5, to which the cell to be programmed is connected, in a per se known manner.

At the end of the preset sequence of programming pulses, the logic control unit 37 controls the analog multiplexer 17 so as to connect the selected bit line 5 with the inverting input of the operational amplifier 25, and the selector 28 so as to connect the output node 26 of the operational amplifier 25 with the output 31 of the selector 28, and hence with the selected word line 4. In practice, in this situation, a feedback loop is obtained including the cell 2 and the operational amplifier 25. In this condition, as described in detail in EP-A-0833348, at equilibrium, voltage $V_{OUT}$ on the output 26 of the operational amplifier 25 is proportional to the present threshold voltage of the selected cell 2, according to the following relation:

$$V_{OUT}=K_1+V_{th} \tag{1}$$

wherein $K_1$ is a constant which depends upon the bias current and upon the cell parameters and is hence known. In addition, given the linear relation between $V_{OUT}$ and $V_{th}$, if the cell 2 is read with the same feedback loop, the output voltage $V_{OUT}$ may be used as the threshold voltage of the cell to be compared to the desired value.

The logic control unit 37, which receives the output voltage $V_{OUT}$ of the operational amplifier 25 and knows the voltage at which the memory cell 2 is to be programmed, can moreover calculate the number N of programming pulses of each sequence according to the relation:

$$N=(V_F-V_0)/\Delta V \tag{2}$$

wherein $V_F$ is the final or intermediate voltage desired, $V_0$ is the voltage at the start of the considered pulse sequence, and $\Delta V$ is the amplitude of the step set at that moment.

Figure 1:
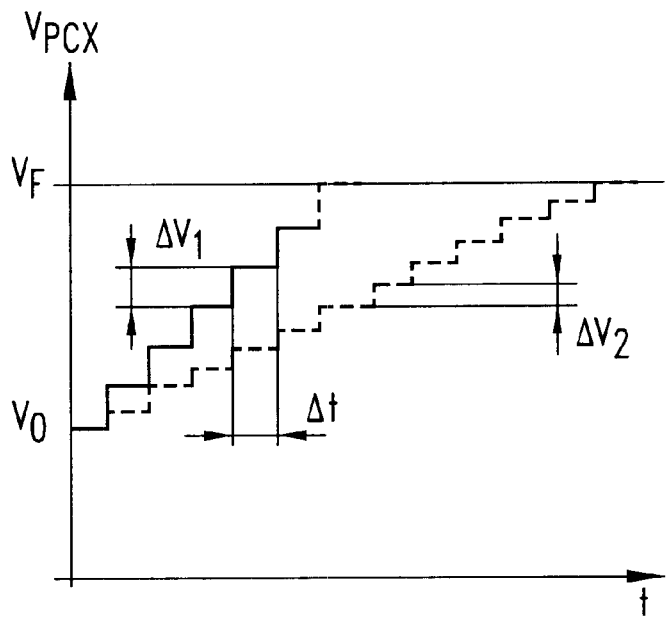
FIG. 1 illustrates the waveform of the ramp voltage applied to the gate terminal of a memory cell, with two pulse sequences of different amplitude.
Figure 3:
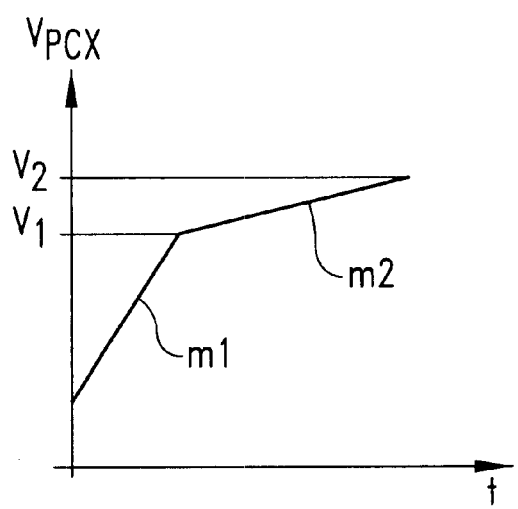
FIG. 3 shows the pattern of the average slope of the ramp voltage applied to the gate terminal of cells to be programmed, according to the present method.

According to the present method, initially the ramp generator 34 supplies at the output a voltage increasing with steps of high amplitude until it reaches a threshold value that is less than the value to be programmed. This first step, wherein in practice the programming voltage applied to the control gate terminal of the cell 2 to be programmed increases with a high average slope indicated by m1 in FIG. 3 until the gate voltage $V_{pcx}$ reaches an intermediate value V1, is advantageously used when a high voltage value is to be programmed for which a high number of programming pulses is necessary. The first step, which is low precision, thus makes it possible to rapidly approach the desired threshold value. Then, the ramp generator 34 generates a ramp increasing with steps of small amplitude so as to obtain a greater precision. Advantageously, after a short period required for the circuit to adjust to the new average slope (indicated by m2 in FIG. 3), the control unit 37 reads the reached threshold value and calculates the number of pulses needed for reaching the final threshold voltage corresponding, in FIG. 3, to the value V2 of the gate voltage $V_{pcx}$.

Thereby, fast and not very precise programming is obtained at the start, and slower and more precise programming is obtained only at the end of programming, so achieving time saving.

Conveniently, in the design phase, according to the discrete threshold value set for the memory 1, and the duration of the pulses, the levels are preset for which it is convenient to follow the procedure of variable speed programming and those for which, instead, it is preferable to follow, right from the start, the procedure of slow and precise programming, so as to prevent the risk of overprogramming or simply because no significant time saving is achieved.

In addition, advantageously, in the design phase the number of pulses to be applied to arrive at an intermediate threshold value for which the maximum advantage is achieved in terms of time without risk of overprogramming is also determined for each threshold level associated to the variable speed programming procedure.

Conveniently, both the threshold levels for which the variable speed programming procedure is applied and the calculated number of high speed pulses are stored in the map 40 (FIG. 2).

On these bases, with reference to FIG. 4, an example embodiment of the present method is now described. In particular, initially (block 100), the logic control unit 37 receives the information necessary for programming a preset cell 2 of the array, including the address of the cell 2 to be programmed and the desired threshold level. Then, the logic control unit 37 appropriately controls the row decoder 7 and the column decoder 13, as well as the analog multiplexer 17 in a known way (block 101). Subsequently, according to the desired threshold level, the logic control unit 37 reads the map 40 to see whether the variable speed programming procedure is to be applied or not, and, in the former case, the number of pulses N1 with step amplitude Δ1 to be applied (block 102).

If the variable speed procedure is to be applied (YES output from block 103), the logic control unit 37 generates the first value of the control signal S and sends it to the ramp generator 34; in addition, it controls the selector 28 to set the latter in the programming position (block 104); the ramp generator 34 then supplies N1 pulses increasing with steps of amplitude Δ1 to the selected word line 4 (block 105).

At the end of the N1 pulses or if only the slow speed procedure is to be used (NO output from block 103), the logic control unit 37 sets the signal S to its second value (block 106), so that the ramp generator 34 supplies at the output a voltage, starting from the value previously reached, that increases with steps having the value of Δ2.

The ramp voltage is supplied for a preset time T (for example, determined experimentally) necessary for the system to reach the steady state condition and corresponding to a number of preset pulses (block 107). Subsequently, the logic control unit 37 controls verify reading of the cell 2, suitably switching the selector 28 (so that this connects the output of the operational amplifier 25 to the selected word line 4) and possibly generating a third value of the signal S to block, temporarily, the generation of further programming pulses; then, it acquires the output voltage $V_{OUT}$ on the node 26 (block 108).

The subsequent steps of the present method repeat those described in the above referred European Patent Application No. 97830566.2. In brief, now, the control unit 37 calculates the number N2 of pulses necessary for reaching the desired threshold voltage $V_T$, according to the following relation:

$$N^2 = (V_T - V_{OUT})/\Delta 2$$

(block 109); controls execution of N2 pulses through the signal S (block 110); carries out a new verify read operation (block 111); verifies whether the desired threshold voltage $V_T$ has been already reached (block 112); if it has not been reached (NO output), calculates again the number of pulses N2 still necessary for reaching the desired threshold voltage; if the desired threshold voltage has been reached, the programming procedure terminates.

The described programming method thus makes it possible to program memory cells in a time that, on average, is shorter than the time involved in the method described in the above mentioned European Patent Application No. 97830566.2, albeit maintaining the desired precision level. In fact, the present method enables a threshold level, not far from the final desired threshold level, to be reached in a short time, and more precise programming to be carried out only at the end; furthermore it does not require for the threshold of the cell 2 to be programmed to be preliminary verified. In fact, it is not necessary to know beforehand with precision the intermediate programming level that is reached through fast programming, and the verify steps can thus start after the slope change. In practice, the present method uses some of the same programming and reading circuitry as that described in the European Patent Application No. 97830566.2, and also employs the use of a programmable ramp generator as well as the storage of the data regarding the advisability of and modalities for carrying out variable speed programming.

Finally, it is evident that modifications and variants can be made to the described method, without departing from the scope of the present invention.

For instance, even though the described embodiment refers to the use of discrete ramp voltages, the invention can be used also for systems that employ continuous ramps. In the latter case, then, the method allows the selected word line to be supplied with two ramp voltages having two different effective slopes, namely, a first steeper slope, to obtain a first fast programming step, and a second slope, lower than the first, to obtain high programming precision. In addition, it is possible also to devise solutions that envisage more than two values of the ramp slope, for example, three values: a higher, initial value, an intermediate value, and a lower, final, value.

The (effective or average) slope value in the various programming steps can be fixed once and for all, according to the desired number of levels and threshold values, in the design phase or in the final testing phase, or can be chosen each time by the control unit 37 from a plurality of values stored in memory.

The decision whether to carry out variable speed programming can be taken, instead of by using a prestored map, by verifying each time whether the threshold voltage value or the level to be programmed exceeds a preset value.

Finally, the described method can be applied also to solutions not employing the algorithm described in the above mentioned European Patent Application No. 97830566.2, i.e., wherein it is preferred to verify the threshold value reached after each programming pulse.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A programming method for a cell of a nonvolatile memory having a gate terminal, comprising:
   applying a ramp voltage to said gate terminal, wherein said step of applying a ramp voltage comprises the steps of:
   generating a first ramp voltage having a first slope; and
   subsequently generating a second ramp voltage having a second slope smaller than the first slope.

2. A method according to claim 1, wherein said first ramp voltage and second ramp voltage are of discrete type, and each comprises a plurality of pulses having linearly increasing amplitudes.

3. A method according to claim 1 wherein said second voltage is generated starting from a final value of said first ramp voltage.

4. A method according to claim 1 wherein, before said step of applying, the steps are carried out of:
acquiring a voltage value to be programmed;
discriminating between a first programming procedure comprising said steps of generating a first ramp voltage and a second ramp voltage, and a second programming procedure comprising the step of generating a single ramp voltage having a third slope.

5. A method according to claim 4, wherein said third slope is equal to said second slope.

6. A method according to claim 4 wherein said discriminating step comprises the step of reading a map that stores a decision between said first programming procedure and said second programming procedure.

7. A method according to claim 6, wherein said map further stores a parameter correlated to the duration of said step of generating said first ramp voltage.

8. A method according to claim 7, wherein parameter comprises a plurality of voltage pulses to be applied.

9. A method according to claim 1 wherein said step of generating a ramp voltage comprises the steps of:
supplying said second ramp voltage to said control terminal for a first preset time interval;
determining a threshold value reached by said cell;
determining a second time interval necessary for reaching a desired threshold value; and
supplying said second ramp voltage for a time correlated to said second time interval.

10. A multilevel nonvolatile memory, comprising a plurality of cells having a gate terminal, and generator means for generating a ramp voltage, said generator means being connectable to said gate terminal, wherein said generator means comprises a programmable ramp generator generating in sequence at least a first ramp voltage having a first slope and, then, a second ramp voltage having a second slope, lower than the first slope.

11. A memory according to claim 10, further comprising a control unit connected to a control input of said generator means and generating a control signal selecting said first slope or said second slope to be generated.

12. A memory according to claim 10 wherein said ramp generator is of discrete type.

13. A memory according to claim 11, further comprising a memory connected to said control unit and storing correlations between desired voltage levels and the activation of said first ramp voltage and second ramp voltage.

14. A programmable memory device, comprising:
a memory cell having a control terminal; and
a first ramp generator coupled to the control terminal of the memory cell, the ramp generator being structured to generate a first ramp voltage having a first slope and, then, a second ramp voltage having a second slope, lower than the first slope.

15. The memory device of claim 14, further comprising a control unit connected to a control input of the first ramp generator, the control unit being structured to generate on the control input a first control signal selecting the first slope and then a second control signal selecting the second slope.

16. The memory device of claim 15, further comprising a storage unit coupled to the control unit, the storage unit storing indications of the first and second slopes of the first and second ramp voltages to be applied by the first ramp generator.

17. The memory device of claim 14, further comprising:
a second ramp generator structured to generate at an output a third ramp voltage having a third slope;
a controlled switch having a control input, first and second signal inputs and an output, the first signal input being connected to an output of the first ramp generator, the second signal input being coupled to the output of the second ramp generator, and the output being coupled to the control terminal of the memory cell; and
a control unit coupled to the control input of the controlled switch, the control unit being structured to cause the control switch to electrically connect the first ramp generator to the control terminal of the memory cell during a first programming phase and to electrically connect the second ramp generator to the control terminal of the memory cell during a second programming phase.

18. The memory device of claim 17 wherein the second ramp generator includes an input coupled to a conduction terminal of the memory cell to form a feedback circuit that includes the memory cell, ramp generator, and controlled switch.

19. The memory device of claim 18 wherein the second ramp generator is structured to read a threshold voltage of the memory cell via the conduction terminal of the memory cell and cause the control unit to cause the control switch to electrically connect the second ramp generator to the control terminal of the memory cell when the threshold voltage of the memory cell reaches a predetermined threshold value.

20. A programmable memory device, comprising:
a memory cell having a control terminal;
a first ramp generator structured to generate a first ramp voltage having a first slope;
a second ramp generator structured to generate a second ramp voltage having a second slope; and
a switch having first and second inputs and an output, the first input being coupled to the first ramp generator, the second input being coupled to the second ramp generator, and the output being coupled to the control terminal of the memory cell, the switch being structured to supply to the control terminal the first ramp voltage from the first ramp generator during a first programming phase and the second ramp voltage from the second ramp generator during a second programming phase.

21. The memory device of claim 20 wherein the first ramp generator is structured to generate the first ramp voltage during a first portion of the first programming phase and a third ramp voltage during a second portion of the first programming phase, the third ramp voltage having a third slope that is less than the first slope.

* * * * *